(12) United States Patent
Paniccia

(10) Patent No.: US 6,785,430 B2
(45) Date of Patent: Aug. 31, 2004

(54) METHOD AND APPARATUS FOR INTEGRATING AN OPTICAL TRANSMIT MODULE

(75) Inventor: Mario J. Paniccia, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 10/084,776

(22) Filed: Feb. 25, 2002

(65) Prior Publication Data

US 2003/0161570 A1 Aug. 28, 2003

(51) Int. Cl.[7] .......................... G02F 1/295; G02F 1/025; G02B 6/10
(52) U.S. Cl. ................................ 385/10; 385/3; 385/8; 385/9; 385/14
(58) Field of Search ................................ 385/4–10, 14, 385/31, 11

(56) References Cited

U.S. PATENT DOCUMENTS

| | | | |
|---|---|---|---|
| 5,247,594 A | 9/1993 | Okuno et al. | |
| 5,263,102 A | 11/1993 | Hakogi | |
| 5,479,552 A | 12/1995 | Kitamura et al. | |
| 5,566,263 A | 10/1996 | Smith et al. | |
| 5,908,305 A | 6/1999 | Crampton et al. | |
| 6,172,791 B1 * | 1/2001 | Gill et al. | 359/249 |
| 6,330,255 B1 * | 12/2001 | Hung | 372/20 |
| 6,480,513 B1 * | 11/2002 | Kapany et al. | 372/20 |
| 2002/0197011 A1 * | 12/2002 | Liu et al. | 385/37 |
| 2003/0021305 A1 * | 1/2003 | Lundqvist | 372/20 |
| 2003/0025976 A1 * | 2/2003 | Wipiejewski | 359/240 |
| 2003/0086655 A1 * | 5/2003 | Deacon | 385/50 |
| 2003/0091086 A1 * | 5/2003 | Sahara et al. | 372/50 |
| 2003/0099018 A1 * | 5/2003 | Singh et al. | 359/152 |

FOREIGN PATENT DOCUMENTS

| | | | |
|---|---|---|---|
| EP | 1094574 A * | 4/2001 | H01S/5/026 |
| JP | 10213784 | 8/1998 | |
| JP | 11211924 | 6/1999 | |
| JP | 2000124543 | 4/2000 | |
| WO | WO 00/67407 | 11/2000 | |
| WO | PCT/US03/04638 | 9/2003 | |

OTHER PUBLICATIONS

E.D. Novak, L. Ding, Y.T. Loh, and C. Hu, "Speed, Power, and Yield Comparison of Thin Bonded SOI versus Bulk SMOS Technologies", in Proceedings 1994 IEEE International SOI Conference, Oct. 1994, VLSI Technology, Inc., San Jose, CA, pp. 41–42.

Willner, A.E., "Tunable Compensation of Channel Degrading Effects Using Nonlinearly Chirped Passive Fiber Bragg Gratings", IEEE Journal of Selected Topics in Quantum Electronics, vol. 5, No. 5, pp. 1298–1311, Sep./Oct. 1999.

(List continued on next page.)

Primary Examiner—John D. Lee
(74) Attorney, Agent, or Firm—Blakely, Sokoloff, Taylor & Zafman LLP

(57) ABSTRACT

An optical transmit module. In one aspect of the present invention, an optical beam is generated with a gain medium disposed in a semiconductor substrate. A tunable Bragg grating also disposed in the semiconductor substrate may be optically coupled to the gain medium to tune an output wavelength of the optical beam. The semiconductor substrate further includes an optical modulator optically coupled to receive the optical beam. The optical modulator is coupled to modulate the optical beam in response to a modulation signal.

29 Claims, 10 Drawing Sheets

OTHER PUBLICATIONS

Giles, C.R., "Lightwave Applications of Fiber Bragg Gratings", Journal of Lightwave Technology, vol. 15, No. 8, pp. 1391–1404, Aug. 1997.

Sugden, K., "Fabrication and Characterization of Bandpass Filters Based on Concatenated Chirped Fiber Gratings", Journal of Lightwave Technology, vol. 15, No. 8, pp. 1424–1432, Aug. 1997.

Erdogan, T.,"Fiber Grating Spectra", Journal of Lightwave Technology, vol. 15, No. 8, pp. 1277–1294, Aug. 1997.

Hill, K. O., "Fiber Bragg Grating Technology Fundamentals and Overview", Journal of Lightwave Technology, vol. 15, No. 8, pp. 1263–1276, Aug. 1997.

Studenkov, P.V., "Asymmetric Twin–Waveguide 1.55–mm Wavelength Laser with a Distributed Bragg Reflector", IEEE Photonics Technology Letters, vol. 12, No. 5, pp. 468–470, May 2000.

"Encyclopedia.com—Results for laser", http://www.encyclopedia.com/articles/07237.html.

"Encyclopedia.com—Results for laser: Coherent Light and Its Emission in Lasers", http://www.encyclopedia.com/articles/07237.html.

"Encyclopedia.com—Results for laser: Characteristics of Lasers", http://www.encyclopedia.com/articles/07237.html.

"Encyclopedia.com—Results for laser: Applications of Lasers", http://www.encyclopedia.com/articles/07237.html.

"Laser", Encarta Encyclopedia, http://encarta.msn.com/Concise.asp?z=1&pg=2&ti=761578658.

"Howstuffworks "How Lasers Work"", http://www.howstuffworks.com/laser.htm.

"The Basics of an Atom", Howstuffworks "How Lasers Work", http://www.howstuffworks.com/laser1.htm.

"The Laser/Atom Connection", Howstuffworks "How Lasers Work", http://www.howstuffworks.com/laser2.htm.

"Three–Level Laser", Howstuffworks "How Lasers Work", http://www.howstuffworks.com/laser3.htm.

"Types of Lasers", Howstuffworks "How Lasers Work", http://www.howstuffworks.com/laser4.htm.

"Laser Classifications", Howstuffworks "How Lasers Work", http://www.howstuffworks.com/laser5.htm.

"Links", Howstuffworks "How Lasers Work", http://www.howstuffworks.com/laser6.htm.

Maluf, N., "Lasers: A Tutorial", New Focus, Opticon 2001, San Jose, CA., pp 1–48.

Fischer, U., et al., "Singlemode Optical Switches Based On SO1 Waveguides With Large Cross–Section," Electronics Letters, vol. 30, No. 5, (Mar. 3, 1994), pp. 406–408.

Fischer, U. et al., "Integrated Optical Waveguide Switches in SO1, " Proceedings 1995 IEEE International SO1 Conference, (Oct. 1995), pp. 141–142.

Cutolo, A. et al, "An Electrically Controlled Bragg Reflector Integrated in a Rib Silicon On Insulator Waveguide," Appl. Phys. Lett. 71 (2), (Jul. 14, 1997), pp. 199–201.

* cited by examiner

METHOD AND APPARATUS FOR INTEGRATING AN OPTICAL TRANSMIT MODULE

BACKGROUND OF THE INVENTION

1. Field of the Invention

The present invention relates generally to communications and, more specifically, the present invention relates to optical communications.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) systems and Gigabit (GB) Ethernet systems provide a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers and lasers.

Lasers are well known devices that emit light through stimulated emission, produce coherent light beams with a frequency spectrum ranging from infrared to ultraviolet, and may be used in a vast array of applications. For example, in optical communications or networking applications, semiconductor lasers may be used to produce light or optical beams on which data or other information may be encoded and transmitted.

Other devices used in optical communications or networking applications are fiber-based Bragg gratings. A fiber Bragg grating is an optical fiber with periodic changes in the refractive index of fiber core materials along the fiber length, which may be formed by exposure of the photosensitive core to an intense optical interference pattern. With the changes in the refractive index along the fiber length, optical beams at a particular wavelength are reflected by the fiber Bragg grating while other wavelengths are allowed to propagate through the fiber.

A limitation with fiber Bragg gratings is that the particular wavelength that is reflected by the fiber Bragg grating is substantially fixed. Consequently, if different wavelengths of light are to be reflected, different fiber Bragg gratings are utilized. In some known fiber Bragg gratings, nominal adjustments to the reflected wavelength may be provided by physically or mechanically stretching the optical fiber of the fiber Bragg grating to modify the length of the optical fiber. The disadvantage of this technique is that the amount of adjustment to the reflected wavelength is relatively small and the optical fiber may suffer damage from the physical stress and strain of the stretching.

Additional devices used in optical communications include optical transmitters which are key components in broadband DWDM networking systems and in Gigabit (GB) Ethernet systems Currently, most optical transmitters are based on a number of fixed wavelength lasers combined with an external modulator or in some cases a directly modulated laser. After light produced from a laser is modulated, it is multiplexed with an external multiplexer and then sent to an optical fiber network where it may be amplified or directed by an optical switch, or both. Separate lasers and modulators are used for each transmission channel, since the lasers typically produce a fixed wavelength. The costs of producing lasers and associated components are very high, however, and using separate components for each wavelength of light to be transmitted can be expensive and inefficient.

BRIEF DESCRIPTION OF THE DRAWINGS

The present invention is illustrated by way of example and not limitation in the accompanying figures.

DETAILED DESCRIPTION

Methods and apparatuses for integrating a tunable laser and an optical modulator into a single substrate are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

In one embodiment of the present invention, an optical beam is generated with a diode or gain medium disposed in a semiconductor substrate. A tunable Bragg grating also disposed in the semiconductor substrate may be optically coupled to the gain medium to tune an output wavelength of the optical beam. Together, the Bragg grating and the gain medium are included in a tunable laser. The semiconductor substrate further includes an optical modulator, which can modulate the optical beam in response to a modulator signal. Such an integration of a tunable laser and modulator into a single semiconductor chip allows for multiple lasers and transmitters to be added to a single module. This lowers optical transmission costs as a single module can be used for transmission of different wavelengths.

Figure 1:
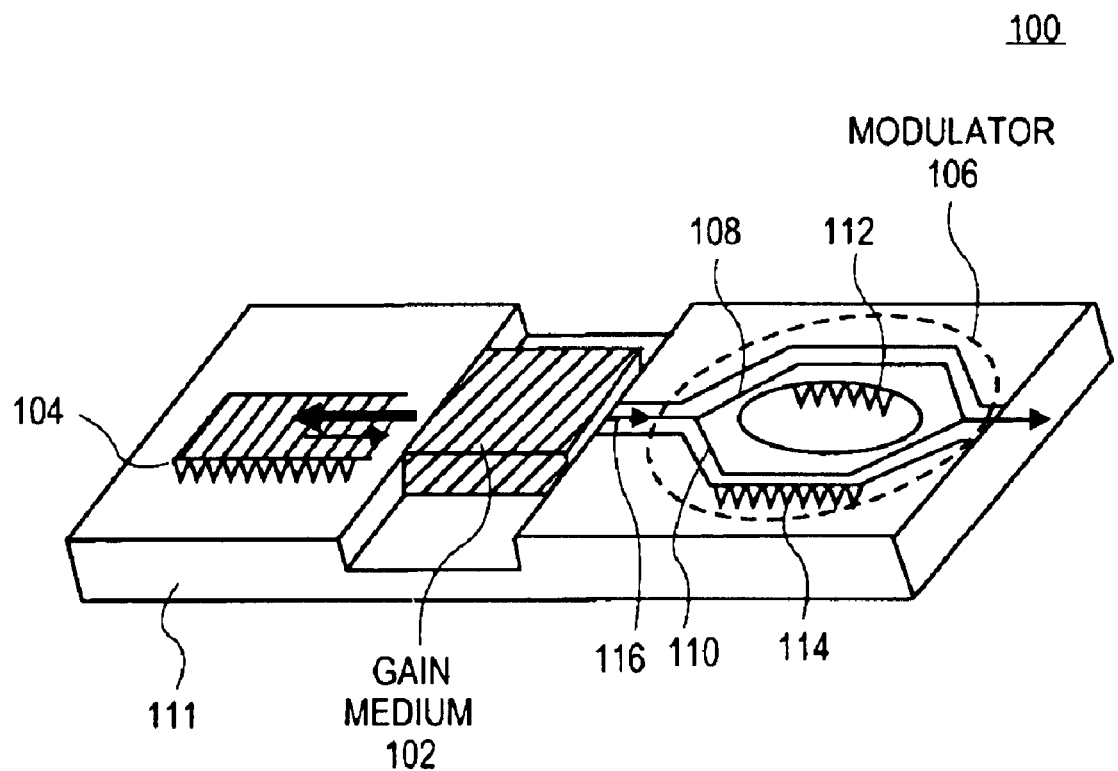
FIG. 1 is a diagram illustrating one embodiment of an integrated optical transmit module in accordance with the teachings of the present invention.

FIG. 1 is a diagram illustrating one embodiment of an integrated optical transmit module 100 in accordance with the teachings of the present invention. As shown, one embodiment of integrated optical transmit module 100 is disposed on a silicon-on-insulator (SOI) wafer including a semiconductor substrate 111. The substrate 111 may include a tunable laser, which includes a gain medium 102 optically coupled to a tunable Bragg grating 104 that can tune to an output wavelength of an optical beam 116 generated from gain medium 102. As shown, the gain medium 102 and tunable Bragg grating 104 are both disposed in semiconductor substrate 111. In one embodiment, gain medium 102 includes a diode such as, for example, an InP diode, or the like. In one embodiment, an optical coupling of gain medium 102 and tunable Bragg grating 104 defines a laser cavity disposed in semiconductor substrate 111. An optical modulator 106 also disposed in semiconductor substrate 111 may be optically coupled to gain medium 102 to modulate the optical beam 116 from gain medium 102 in response to a modulation signal.

As shown, optical modulator 106 includes first and second optical paths 108 and 110 through the semiconductor substrate 111. In operation, a first portion of the optical beam 116 may be directed through first optical path 108 and a second portion of the beam 116 may be directed through second optical path 110. As will be discussed in further detail below, first and second optical phase adjusting devices 112 and 114 may be disposed in semiconductor substrate 111 along optical paths 108 and 110, respectively, to adjust a phase difference between the first and second portions of the optical beam 116 in response to phase adjustment signals. In one embodiment, after passing through a plurality of charged modulated region created by phase adjusting devices 112 and/or 114, the first and second portions of optical beam 116 are merged in semiconductor substrate 111 such that optical beam 116 is modulated. In one embodiment, as shown, both optical paths 108 and 110 include phase adjusting devices 112 and 114. In another embodiment, only one of the optical paths 108 and 110 include a phase adjusting device 112 or 114.

Figure 2:
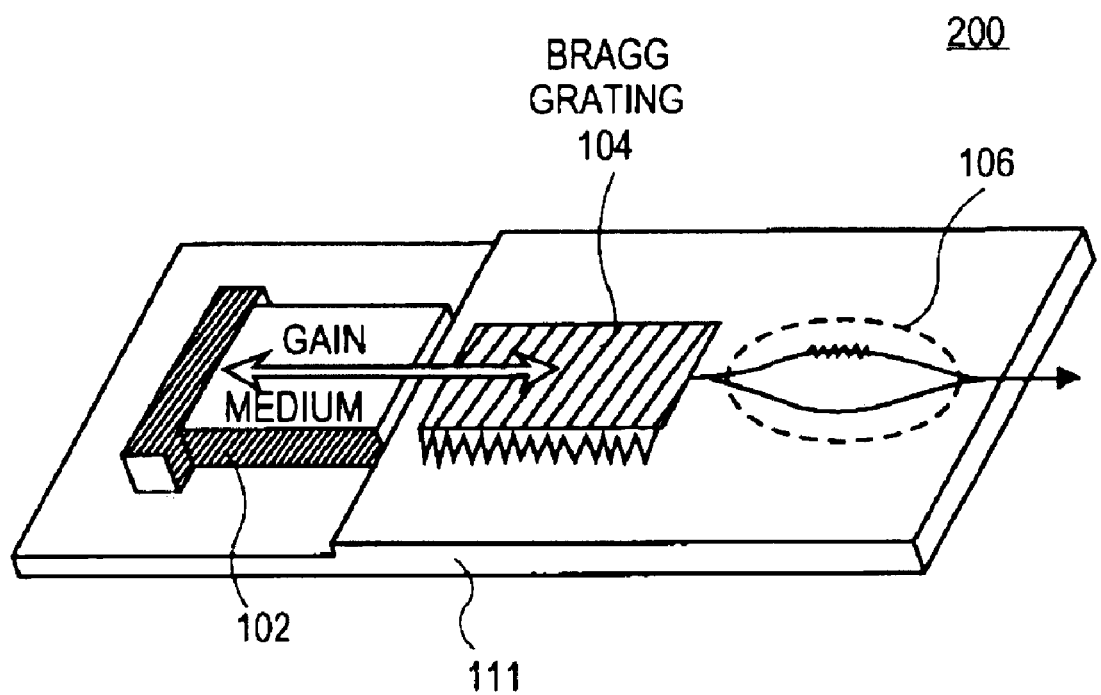
FIG. 2 is diagram illustrating another embodiment of an integrated optical transmit module in accordance with the teachings of the present invention.

As illustrated in the depicted embodiment, optical transmit module 100 includes gain medium 102 disposed between tunable Bragg grating 104 and optical modulator 106. It is appreciated that other suitable configurations may also be used. For example, as shown in FIG. 2, optical transmit module 200 includes tunable Bragg grating 104 disposed between gain medium 102 and modulator 106 in semiconductor substrate 111.

Figure 3:
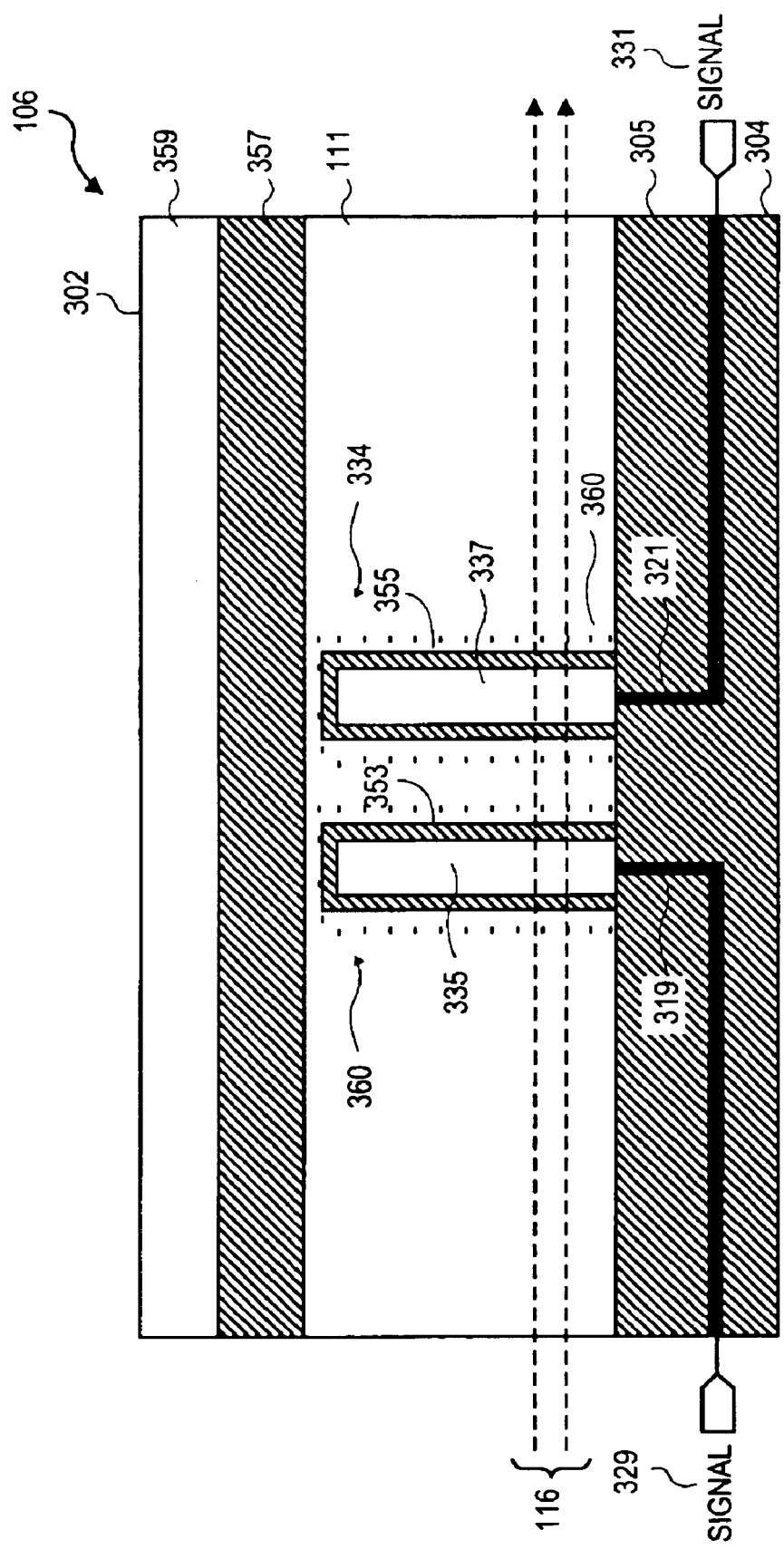
FIG. 3 is a side view illustration of one embodiment of an optical modulator that may be included in the optical transmit module in accordance with the teachings of the present invention.

FIG. 3 is a side view illustration of one embodiment of one of the optical paths 108 or 110 of optical modulator 106 that may be included in the optical transmit module 100 or 200 in accordance with the teachings of the present invention. In one embodiment, the optical path of optical modulator 106 of the present invention includes a phase adjusting device 334, which in one embodiment includes a plurality of charge modulated regions 360 provided with an array of trench capacitors including trench capacitor 335 and trench capacitor 337, as illustrated in FIG. 3. In one embodiment, trench capacitors 335 and 337 include polysilicon disposed in a semiconductor substrate 111 of optical modulator 106. As illustrated in FIG. 3, one embodiment of optical modulator 106 includes an insulating region 353 disposed between the polysilicon of trench capacitor 335 and the semiconductor substrate 111. Similarly, an insulating region 355 is disposed between the polysilicon of trench capacitor 337 and the semiconductor substrate 111.

In one embodiment, a modulation signal 329 and a modulation signal' 331 are coupled to be received by trench capacitors 335 and 337, respectively, of phase adjusting device 334. In one embodiment, modulation signal 329 and modulation signal' 331 are generated by control circuitry on the integrated circuit die of phase adjusting device 334. In one embodiment, the control circuit generating modulation signal 329 and modulation signal' 331 is disposed in semiconductor substrate 111 outside of an optical path of an optical beam 116 directed through semiconductor substrate 111. In another embodiment, modulation signal 329 and modulation signal' 331 are generated by control circuitry external to the integrated circuit die of optical modulator 106. In one embodiment, modulation signal 329 and modulation signal' 331 are coupled to be received by trench capacitors 335 through conductors 319 and 321, which are disposed in an optical confinement layer 305 of optical modulator 101. In one embodiment, optical confinement layer 305 is an insulating layer and includes a dielectric layer of optical modulator 106.

In one embodiment, modulation signal 329 and modulation signal' 331 are a plurality of signals separately coupled to be received by the trench capacitors 335 and 337 in optical modulating device 334. For example, in one embodiment, modulation signal 329 and modulation signal' 331 are the same signals having opposite polarities. In another embodiment, modulation signal 329 and modulation signal' 331 are the same signals having the same polarities. In yet another embodiment, modulation signal 329 and modulation signal' 331 are separate signals coupled to capacitors across the array to control or modulate a charge distribution of free charge carriers in the plurality of charge modulated regions 360 across the array of trench capacitors 335 and 337.

In one embodiment, an optical beam 116 is directed from the gain medium 102 and/or the tunable Bragg grating 104 of the tunable laser through semiconductor substrate 111 to the array of trench capacitors 335 and 337 of phase adjusting device 334. As mentioned, in one embodiment, semiconductor substrate 111 includes silicon, trench capacitors 335 and 337 include polysilicon and optical beam 116 includes infrared or near infrared laser light. As known to those skilled in the art, silicon is partially transparent to infrared or near infrared light. For instance, in one embodiment in which phase adjustment device 334 is utilized in telecommunications, optical beam 116 has an infrared wavelength of approximately 1.55 or 1.3 micrometers.

In one embodiment, optical modulator 106 includes an optical confinement layer 357 disposed proximate to semiconductor substrate 111. Thus, semiconductor substrate 111 is disposed between optical confinement layer 357 and optical confinement layer 305. In one embodiment, optical confinement layer 357 is an insulating layer. In particular, optical energy or light from optical beam 116 is reflected from the interfaces between semiconductor substrate 111 and optical confinement layer 357 or optical confinement layer 305. In the embodiment depicted in FIG. 3, optical beam 116 is deflected off the interface between semiconductor substrate 111 and optical confinement layer 357 or optical confinement layer 305 because of total internal reflection. As a result of the total internal reflection, optical beam 116 is in one embodiment confined to remain with semiconductor substrate 111 using optical confinement layer 357 and optical confinement layer 305 until optical beam 116 exits semiconductor substrate 111.

In one embodiment, the phase of the optical beam 116 that passes through the plurality of charged modulated regions 360 surrounding the trench capacitors 335 and 337 is modulated in response to the modulation signal. In one embodiment, the phase of optical beam 116 passing through free charge carriers in the plurality of charged modulated regions 360 is modulated due to the plasma optical effect. The plasma optical effect arises due to an interaction between the optical electric field vector and free charge carriers that may be present along the propagation path of the optical beam 116. The electric field of the optical beam 116 induces a change in the velocity of the free charge carriers and this effectively perturbs the local dielectric constant of the medium. This in turn leads to a perturbation of the propagation velocity of the optical wave and hence the refractive index for the light, since the refractive index is simply the ratio of the speed of the light in vacuum to that in the medium. The free charge carriers are accelerated by the field and also lead to absorption of the optical field as optical energy is used up. Generally the refractive index perturbation is a complex number with the real part being that part which causes the velocity change and the imaginary part being related to the free charge carrier absorption. The amount of phase shift φ is given by $$\phi = (2\pi/\lambda)\Delta nL \qquad \text{(Equation 1)}$$

with the optical wavelength in vacuum λ and the interaction length L. In the case of the plasma optical effect in silicon, the refractive index change Δn due to the electron ($\Delta N_e$) and hole ($\Delta N_h$) concentration change is given by:

$$\Delta n = -\frac{e^2\lambda^2}{8\pi^2 c^2 \varepsilon_0 n_0}\left(\frac{\Delta N_e}{m_e^*} + \frac{\Delta N_h}{m_h^*}\right) \qquad \text{(Equation 2)}$$

where $n_o$ is the nominal index of refraction for silicon, e is the electronic charge, c is the speed of light, $\varepsilon_0$ is the permittivity of free space, $m_e^*$ and $m_h^*$ are the electron and hole effective masses, respectively.

It is noted that phase adjusting device 334 of optical modulator 106 has been illustrated in FIG. 3 with two trench capacitors 335 and 337. It is appreciated that in other embodiments, phase adjusting device 334 may include a greater or fewer number of trench capacitors in accordance with the teachings of the present invention with the number of trench capacitors chosen to achieve the required phase shift.

It is noted that for explanation purposes, charge modulated regions 360 have been illustrated to include negative charge. It is appreciated that in another embodiment, the polarities of these charges and the polarities of modulation signal 329 and modulation signal' 331 may be reversed in accordance with the teachings of the present invention.

Figure 4:
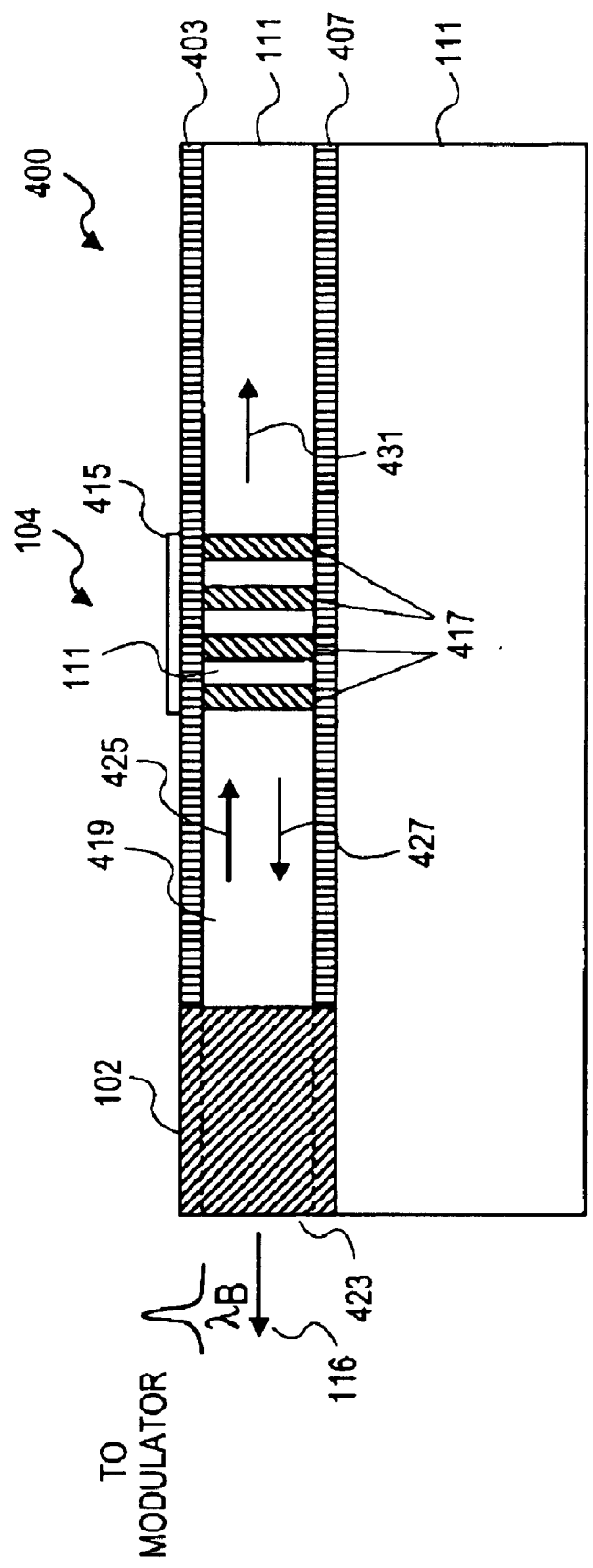
FIG. 4 is a block diagram illustrating one embodiment of a tunable laser that may also be included in the optical transmit module in accordance with the teachings of the present invention.

FIG. 4 is a block diagram illustrating an embodiment of a tunable laser 400 that may be coupled to the optical modulator 106 and included in semiconductor substrate 111 of optical transmit module 100 in accordance with the teachings of the present invention. Tunable laser 400 includes insulating layers 407 and 403 disposed in semiconductor substrate 111.

As illustrated in the depicted embodiment, tunable laser 400 includes gain medium 102 and tunable Bragg grating 104 disposed in semiconductor substrate 111. An optical coupling between gain medium 102 and tunable Bragg grating 104 define a laser cavity 419 disposed in the semiconductor substrate 111. In one embodiment, gain medium 102 includes a diode such as for example an InP diode or the like that includes a cleaved surface or facet forming a reflector 423 of tunable laser 400. In one embodiment, reflector 423 has 99% reflectivity and the other side of gain medium 102 has an anti-reflective (AR) coating with very low reflectivity such as for example $10^{-4}$ reflectivity.

As will be discussed in greater detail below, one embodiment of tunable Bragg grating 104 is formed with a multi-layer structure including alternating regions of polysilicon 417 and semiconductor substrate 111. A thermal heater 415 is disposed as shown proximate to alternating the polysilicon and semiconductor substrate regions 111 to locally adjust the temperature of the semiconductor substrate 111 and polysilicon regions 417 so as to adjust the tunable wavelength of tunable Bragg grating 104.

In one embodiment, the laser cavity 419 is defined in semiconductor substrate 111 between insulating layers 403 and 407 and between reflector 423 of gain medium 102 and tunable Bragg grating 104. As will be discussed in greater detail below, one embodiment of laser cavity 419 is included in gain medium 102 and a waveguide formed in semiconductor substrate 111 between reflector 423 and tunable Bragg grating 104. In one embodiment, tunable Bragg grating 104 acts as a reflector to selectively reflect light at the tunable wavelength of tunable Bragg grating 104.

In operation, electricity is first converted into light with gain medium 102. As can be appreciated by those skilled in the art, this light may be created by for example current injection in semiconductors (gain media) to create electron-hole pairs such that light is produced through electron-hole radiative recombination processes. This light is illustrated in FIG. 4 as optical beam 425 emanating from gain medium 102 in laser cavity 419. In one embodiment, tunable Bragg grating 104 reflects portions of optical beam 425 having a tunable center wavelength equal to the Bragg wavelength $\lambda_B$. This reflected portion having the tunable center equal to $\lambda_B$ is illustrated in FIG. 4 as optical beam 427. The remaining portions or wavelengths included in optical beam 425 not reflected by tunable Bragg grating 104 are illustrated in FIG. 4 as optical beam 431 continuing past tunable Bragg grating 104. Optical beams 425 and 427 continue to reflect back and forth between reflector 423 and tunable Bragg grating 104 such that lasing, or the amplification of stimulated emission of light, occurs in laser cavity 419.

In one embodiment, since the reflection spectrum of tunable Bragg grating 104 has a narrow bandwidth of, for example, <1 nm, the lasing or stimulated emission of light in laser cavity 419 is achieved only in a narrow frequency range. In one embodiment, reflector 423 is only partially reflective such that optical beam 116 is output through the reflector 423 of tunable laser 400. Stated differently, optical beam 116 is tuned to a wavelength of $\lambda_B$ because tunable Bragg grating 104 is tuned to reflect light having a wavelength $\lambda_B$. In one embodiment, the tunable center wavelength of tunable Bragg grating 104 may be tuned or adjusted to tune or adjust the output wavelength of optical beam 116.

In one embodiment, the optical beam 116 having the output wavelength $\lambda_B$ is output from gain medium 102 and is directed to optical modulator 106, such as for example as shown in FIG. 1. In another embodiment it is appreciated that tunable Bragg grating 104 may be only partially reflective to $\lambda_B$ such that optical beam 116 having an output wavelength $\lambda_B$, as a result of the lasing or stimulated emission of light having a wavelength of $\lambda_B$ in laser cavity 419, is output from an end of tunable Bragg grating 104 opposite gain modulator 102. An embodiment illustrating this arrangement of tunable laser 400 is also illustrated for example in FIG. 2. In this embodiment, the side of gain modulator 102 opposite tunable Bragg grating is coated with a highly reflective coating and the side of gain modulator 102 facing tunable Bragg grating 104 has the AR coating for low reflectivity such as for example $10^{-4}$ reflectivity.

Figure 5:
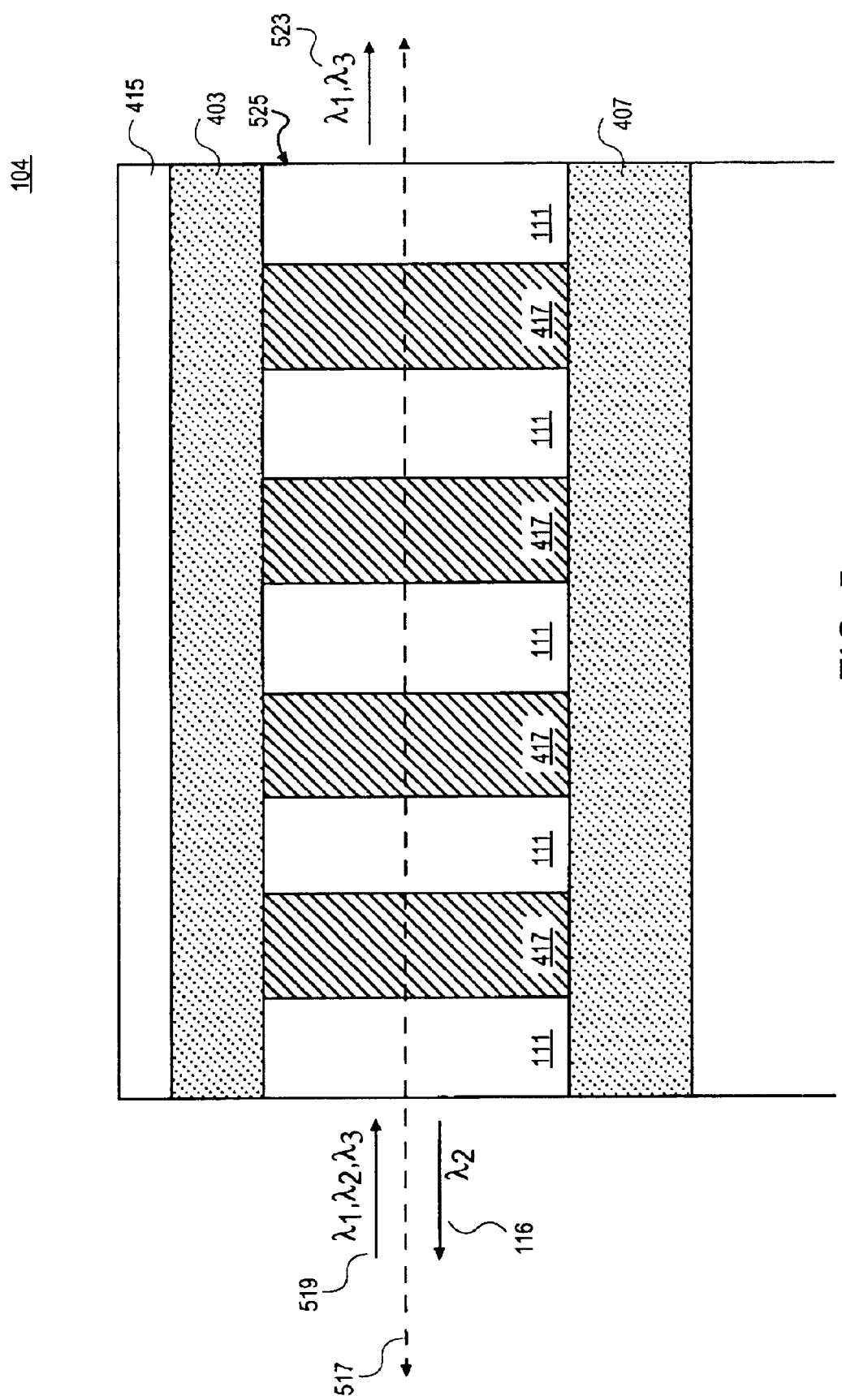
FIG. 5 is a block diagram illustrating a cross section of one embodiment of a tunable Bragg grating disposed in a semiconductor substrate including a heater utilized in the tunable laser that may be included in the optical transmit module in accordance with the teachings of the present invention.

FIG. 5 is a block diagram illustrating a cross section showing greater detail of one embodiment of semiconductor-based tunable Bragg grating 104 disposed in a semiconductor substrate 111 in accordance with the teachings of the present invention. As shown, the plurality of alternating regions of polysilicon 417 are disposed in silicon semiconductor substrate 111 such that periodic or quasi-periodic perturbations in an effective index of refraction $n_{eff}$ are provided along an optical path 517 through semiconductor substrate 111. A waveguide 525 including optical path 517 is provided in semiconductor substrate 111.

In one embodiment in which silicon and polysilicon are utilized, having effective refractive indexes of $n_{Si}$ and $n_{poly}$, respectively, a small effective refractive index difference $n_{eff}$ (or $n_{poly} - n_{Si}$) is provided at each interface between semiconductor substrate 111 and polysilicon 417. In one embodiment, $n_{eff}$ is approximately within the range of 0.005 to 0.03. It is appreciated that other value ranges for $n_{eff}$ may be utilized in accordance with the teachings of the present invention and that 0.005 to 0.03 is provided herewith for explanation purposes. In another embodiment, it is appreciated that other suitable materials may be used instead of silicon and polysilicon so long as an effective refractive index difference is provided at each interface along optical path 517.

Figure 6:
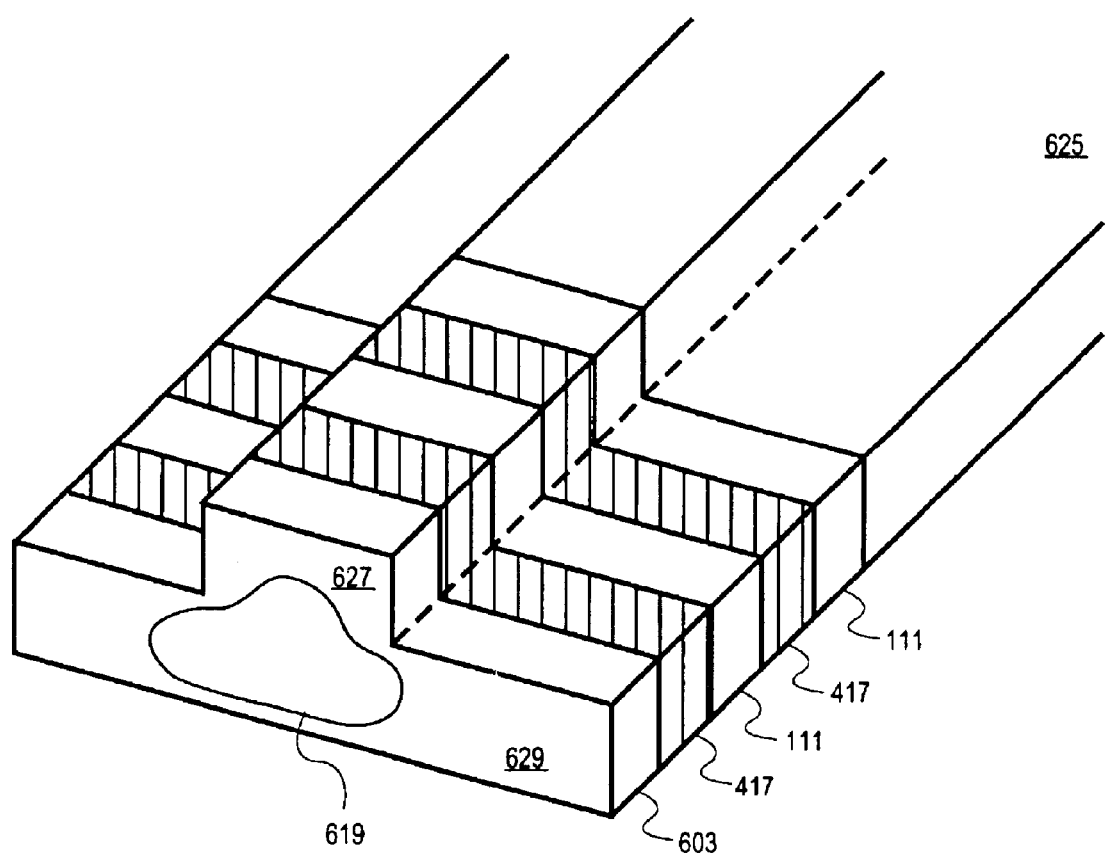
FIG. 6 is a perspective diagram illustrating one embodiment of a tunable Bragg grating disposed in a semiconductor substrate including a rib waveguide disposed in a semiconductor substrate in accordance with the teachings of the present invention.

In one embodiment, waveguide 525 is a rib waveguide. To illustrate, FIG. 6 is a perspective view illustration of one embodiment of a rib waveguide 625 of a tunable Bragg grating in accordance with the teachings of the present invention. In FIG. 6, rib waveguide 625 is disposed in semiconductor substrate 111 and includes regions of polysilicon 417. In one embodiment, the semiconductor substrate 111 has a different index of refraction than polysilicon 417 such that periodic or quasi-periodic perturbations in an effective index of refraction are provided along an optical path through rib waveguide 625.

As shown, rib waveguide 625 includes a rib region 627 and a slab region 629. In the embodiment illustrated in FIG. 6, the intensity distribution of a single mode optical beam 619 is shown propagating through the rib waveguide 625. As shown, the intensity distribution of optical beam 619 is such that the majority of the optical beam 619 propagates through a portion of rib region 627 towards the interior of the rib waveguide 625. In addition, a portion of optical beam 619 propagates through a portion of slab region 629 towards the interior of the rib waveguide 625. As also shown with the intensity distribution of optical beam 619, the intensity of the propagating optical mode of beam 619 is vanishingly small at the "upper corners" of rib region 627 as well as the "sides" of slab region 629.

It is appreciated that although rib waveguide 525 and 625 are illustrated and described in connection with tunable Bragg grating 104, rib waveguides may be used throughout optical modulator 100 in, for example, the optical paths 108 and 110 of optical modulator 106 or other optical couplings or waveguides between the components of optical transmit module 100.

Referring back to the illustration in FIG. 5, an optical beam 519 is directed along optical path 517 into one end of waveguide 525. In one embodiment, optical beam 519 includes infrared or near infrared light and is confined with cladding provided by insulating layers 403 and 407 to remain within waveguide 525 along optical path 517 between the ends of waveguide 525. In one embodiment, optical beam 519 is confined as a result of total internal reflection since the oxide material of insulating layers 403 and 407 has a smaller index of refraction than the semiconductor material of semiconductor substrate 111 and polysilicon 417.

In one embodiment, optical beam 519 includes a plurality of channels having wavelengths including for example $\lambda_1$, $\lambda_2$ and $\lambda_3$. It is appreciated that although optical beam 519 has been illustrated to include three wavelengths $\lambda_1$, $\lambda_2$ and $\lambda_3$ in the illustrated example, a different number of wavelengths maybe be included in optical beam 519 in accordance with the teachings of the present invention.

As mentioned above, there are periodic or quasi-periodic perturbations in the effective index of refraction along optical path 517 through waveguide 525. As a result of the effective refractive index difference $n_{eff}$ described above, a multiple reflection of optical beam 519 occurs at the interfaces between semiconductor substrate 111 and polysilicon 417 along optical path 517. In one embodiment, a Bragg reflection occurs when a Bragg condition or phase matching condition is satisfied. In particular, for uniform Bragg gratings, when the condition $$m\lambda_B = 2n_{eff}\Lambda,\qquad\text{(Equation 3)}$$

is satisfied, where m is the diffraction order, $\lambda_B$ is the Bragg wavelength, $n_{eff}$ is the effective index of the waveguide and $\Lambda$ is the period of the grating, a Bragg reflection occurs.

To illustrate, FIG. 5 shows a Bragg condition existing for $\lambda_B$ equal to $\lambda_2$. Accordingly, optical beam 116 including wavelength $\lambda_2$ is shown to be reflected back out of the waveguide 525 out from the end into which optical beam 519 is directed. In addition, the remainder of optical beam 519 continues to propagate along optical path 517 through waveguide 525 such that the remaining wavelengths (e.g. $\lambda_1$ and $\lambda_3$) are included the an optical beam 523, which is propagated from the opposite end of waveguide 525. In one embodiment, optical beam 519 may be an optical communications beam or the like on which data is encoded. In one embodiment, WDM or DWDM or the like may be employed with optical beam 519 such that a different channel is encoded with each of the wavelengths (e.g. $\lambda_1$, $\lambda_2$, $\lambda_3$, etc.) included in optical beam 519.

In one embodiment, the Bragg wavelength, $\lambda_B$, that is reflected by tunable Bragg grating 104 is tunable or adjustable with a heater 415 disposed proximate to waveguide 525. In an embodiment, heater 415 includes a thin-film heater or the like or other future arising technology that controls the temperature of semiconductor substrate 111 and polysilicon 417 in waveguide 525 along optical path 517. For instance, silicon and polysilicon have large index of refraction variations with temperature on the order of approximately $2\times10^{-4}/°$ K. It is appreciated that the index of refraction variations with temperature for semiconductor materials such as silicon and/or polysilicon are an order of magnitude greater than other materials such as for example silica or the like. Thus, by controlling the temperature of semiconductor substrate 111 and polysilicon 417, relatively significant shifts in the center wavelength of light reflected by a tunable Bragg grating 104 are provided in accordance with the teachings of the present invention.

Figure 7:
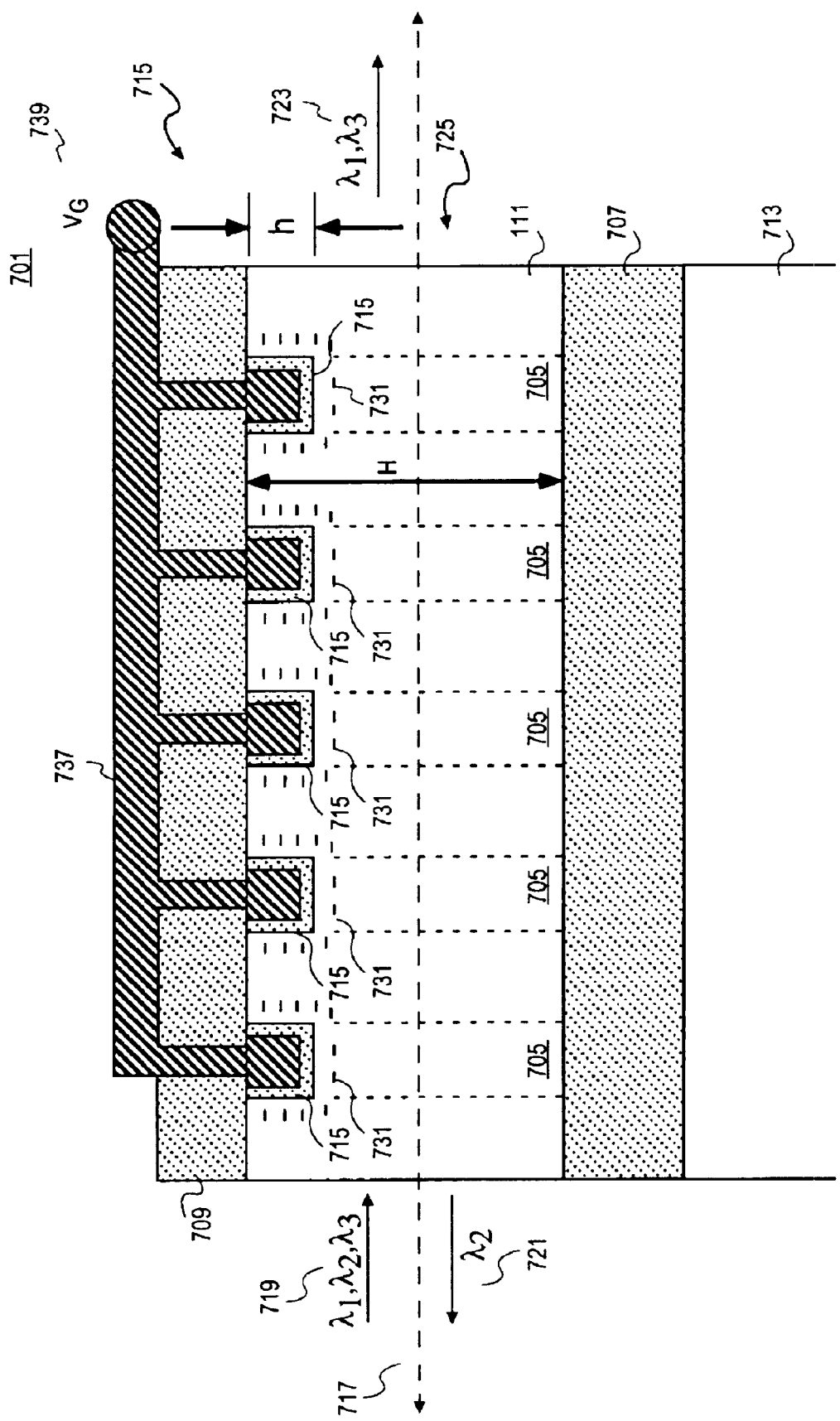
FIG. 7 is a block diagram illustrating a cross section of another embodiment of a tunable Bragg grating disposed in a semiconductor substrate including charge modulated regions in accordance with the teachings of the present invention.

FIG. 7 is a block diagram illustrating a cross section of another embodiment of a tunable Bragg grating 701 in accordance with the teachings of the present invention. It is appreciated that tunable Bragg grating 701 may also be utilized in place of tunable Bragg grating 104 of FIGS. 1, 2, or 4 in accordance with the teachings of the present invention. As shown in the depicted embodiment, tunable Bragg grating 701 includes a semiconductor substrate 111 having an optical path 717 through which an optical beam 719 is directed. In one embodiment, semiconductor substrate 111 is included in an SOI wafer 715 such that semiconductor substrate 111 is disposed between a buried insulating layer 707 and insulating layer 709. In addition, buried insulating layer 707 is disposed between semiconductor substrate layer 111 and semiconductor substrate layer 713. In one embodiment, an optical waveguide 725 is provided with semiconductor substrate 111 with insulating layers 707 and 709 serving as cladding to confine optical beam 719 to remain within waveguide 725 between the ends.

In the embodiment depicted in FIG. 7, tunable Bragg grating 701 is provided with trenched silicon structures. In particular, a plurality of conductor-insulator-semiconductor structures 715, similar to for example metal-oxide-semiconductor (MOS) structures, are disposed along optical path 717 in semiconductor substrate 111. Each structure 715 is coupled to receive a modulation signal $V_G$ 739 through conductor 737, which is coupled to each structure 715 through insulating layer 709. As shown in FIG. 7, the height of each structure 715 in waveguide 725 is h. In one embodiment, the height h of the structures 715 is chosen such that propagation loss of optical beam 717 in waveguide 725 along optical path 717 is acceptable.

In the embodiment depicted in FIG. 7, periodic or quasi-periodic perturbations in an effective index $n_{eff}$ of refraction are provided along an optical path 717 through waveguide 725 in semiconductor substrate 111. In particular, the effective index of refraction $n_{eff}$ is related or equal to a function of the geometry of waveguide 725 along optical path 717 as well as the index of refraction of the specific medium (e.g. $n_{Si}$) and the wavelength λ included in optical beam 719.

Accordingly, assuming semiconductor substrate 111 includes silicon, the effective index of refraction $n_{eff}$ is a function of the height H of waveguide 725 not including structures 715, $n_{Si}$ and λ. In the regions 705 of waveguide 725 including structures 715, the effective index of refraction $n'_{eff}$ is a function of the height (H−h) of waveguide 725 including structures 715, $n_{Si}$ and λ. Thus, the difference in effective index of refraction $$n_{eff}=n_{eff}-n'_{eff}.$$ (Equation 4)

In the depicted embodiment, structures 715 are biased in response to modulation signal $V_G$ 739 through conductor 737 such that the concentration of free charge carriers in charge modulated regions 731 in the semiconductor substrate layer 111 proximate to the structures 715. For example, assuming a positive voltage is applied with modulation signal $V_G$ 739 through conductor 737, electrons in semiconductor substrate 111 are swept into charge modulated regions 731. When for example less positive voltage is applied to conductor 737, the concentration of free charge carriers swept into charge modulated regions 731 is reduced.

It is noted that for explanation purposes, charge modulated regions 731 have been illustrated to include negative charge. It is appreciated that in another embodiment, the polarities of these charges and the voltages of modulation signal $V_G$ 739 maybe reversed in accordance with the teachings of the present invention.

In one embodiment, the effective index of refraction $n_{eff}$ in charge modulated regions 731 is modulated in response to the modulation signal $V_G$ 739 due to the plasma optical effect, as described previously.

It is noted that tunable Bragg grating 701 has been illustrated in FIG. 7 with five structures 715. It is appreciated that in other embodiments, tunable Bragg grating 701 may include a greater or fewer number of structures 715 in accordance with the teachings of the present invention.

In operation, optical beam 719 is directed along optical path 717 into one end of waveguide 725. In one embodiment, optical beam 719 includes infrared or near infrared light and is confined with insulating layers 707 and 709 to remain within waveguide 725 along optical path 717 between the ends of waveguide 725. In one embodiment, optical beam 719 is confined as a result of total internal reflection since the oxide material of insulating layers 707 and 709 has a smaller index of refraction than the semiconductor material of semiconductor substrate 111.

In one embodiment, optical beam 719 includes a plurality of channels corresponding to wavelengths including for example $\lambda_1$, $\lambda_2$ and $\lambda_3$. As a result of the effective refractive index difference $n_{eff}$ described above in the periodic or quasi-periodic perturbations in the effective index of refraction along optical path 717, a multiple reflection of optical beam 719 occurs when a Bragg condition or phase matching condition is satisfied, as described above in Equation 3.

To illustrate, FIG. 7 shows a Bragg condition existing for $\lambda_B$ equal to $\lambda_2$. Accordingly, an optical beam 721 having a center wavelength $\lambda_2$ is shown to be reflected back out of the waveguide 725 out from the end into which optical beam 719 is directed. In addition, the remainder of optical beam 719 continues to propagate along optical path 717 through waveguide 725 such that the remaining wavelengths (e.g. $\lambda_1$ and $\lambda_3$) are included the an optical beam 723, which is propagated from the opposite end of waveguide 725.

In one embodiment, the center wavelength that is reflected or filtered by tunable Bragg grating 701 is tunable or adjustable by appropriately modulating charge in modulated charge regions 731 with modulation signal $V_G$ 739 to adjust the conditions for the Bragg wavelength $\lambda_B$. Indeed, as discussed above, the difference in effective refractive index $\Delta n_{eff}$ along optical path 717 is modulated in response to modulation signal $V_G$ 739 to tune the Bragg wavelength $\lambda_B$ that is reflected by tunable Bragg grating 701 in accordance with the teachings of the present invention.

Figure 8:
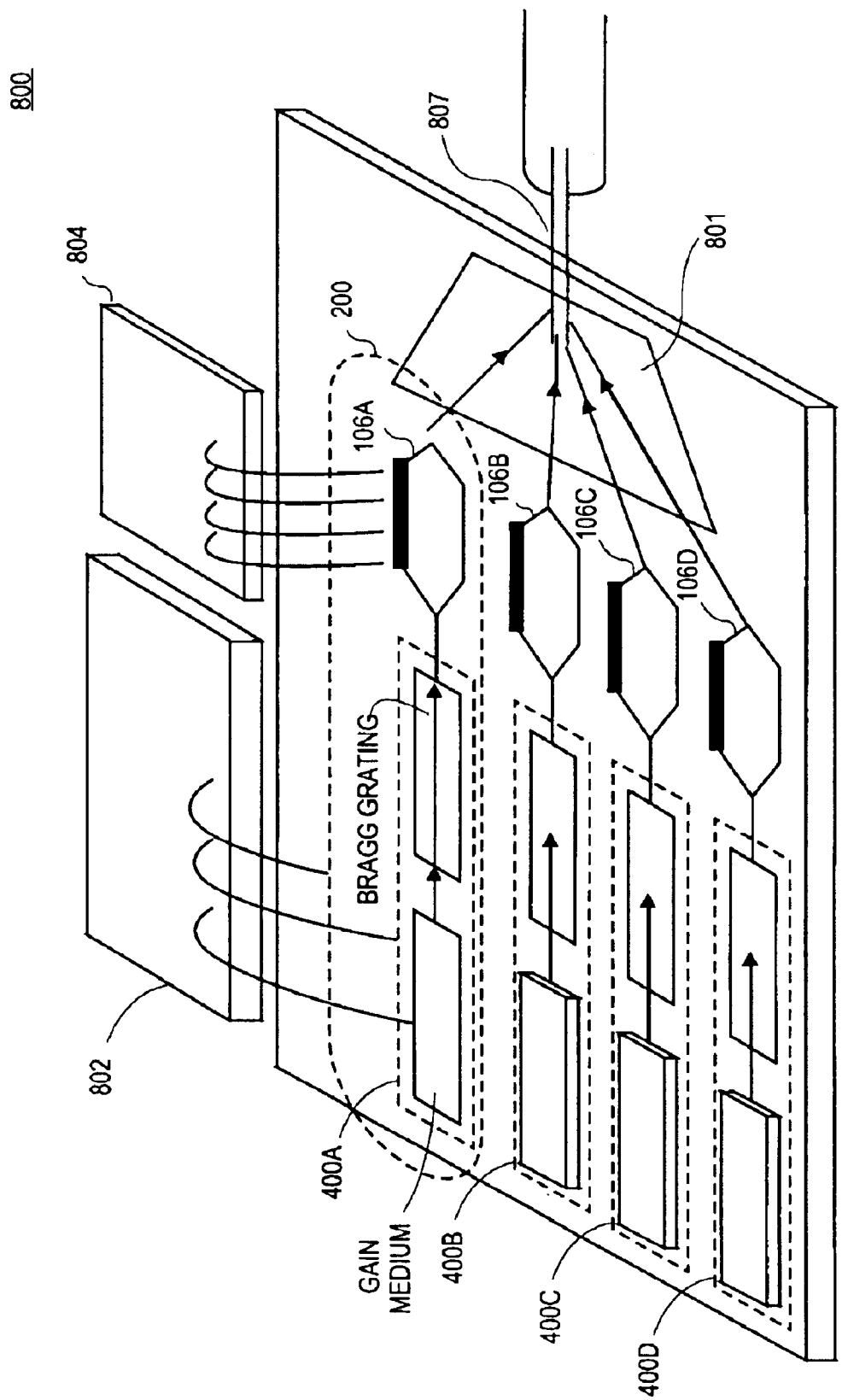
FIG. 8 illustrates another embodiment of the integrated optical transmit module in accordance with the teachings of the present invention.

FIG. 8 illustrates an embodiment where a plurality of optic transmit modules 200 are disposed in a single semiconductor substrate 111 to form an optic transmit module 800 that can generate, tune, and modulate a plurality of optical beams. FIG. 8 shows a first tunable laser 400A in which the tunable laser 400A is one of a plurality of tunable lasers 400A, 400B, 400C and 400D, optically coupled to a respective one of a plurality of optical modulators 106A, 106B, 106C and 106D. Thus, in an embodiment, each optical modulator 106A, 106B, 106C and 106D is optically coupled to receive and modulate an optical beam from a respective tunable laser 400A, 400B, 400C and 400D. Note that in the embodiment depicted in FIG. 8 that each Bragg grating is disposed between gain medium 102 and modulator 106. In another embodiment, gain medium may be disposed between the Bragg grating and modulator.

In one embodiment, a multiplexer 801 may be optically coupled to an output of each optical modulator 106A, 106B, 106C and 106D to multiplex the plurality of optical beams received into a WDM optical beam 807. In an embodiment, as shown in FIG. 8, tunable laser control 802 and modulator control 804 circuitry for the tunable laser 400 and modulator 106, respectively, are shown on separate substrates from semiconductor substrate 111 to generate the respective control modulation signals. In another embodiment, tunable laser control 802 and modulator control circuitry 804 may be included on the same semiconductor substrate 111 as the plurality of optic transmit modules 200.

Figure 9:
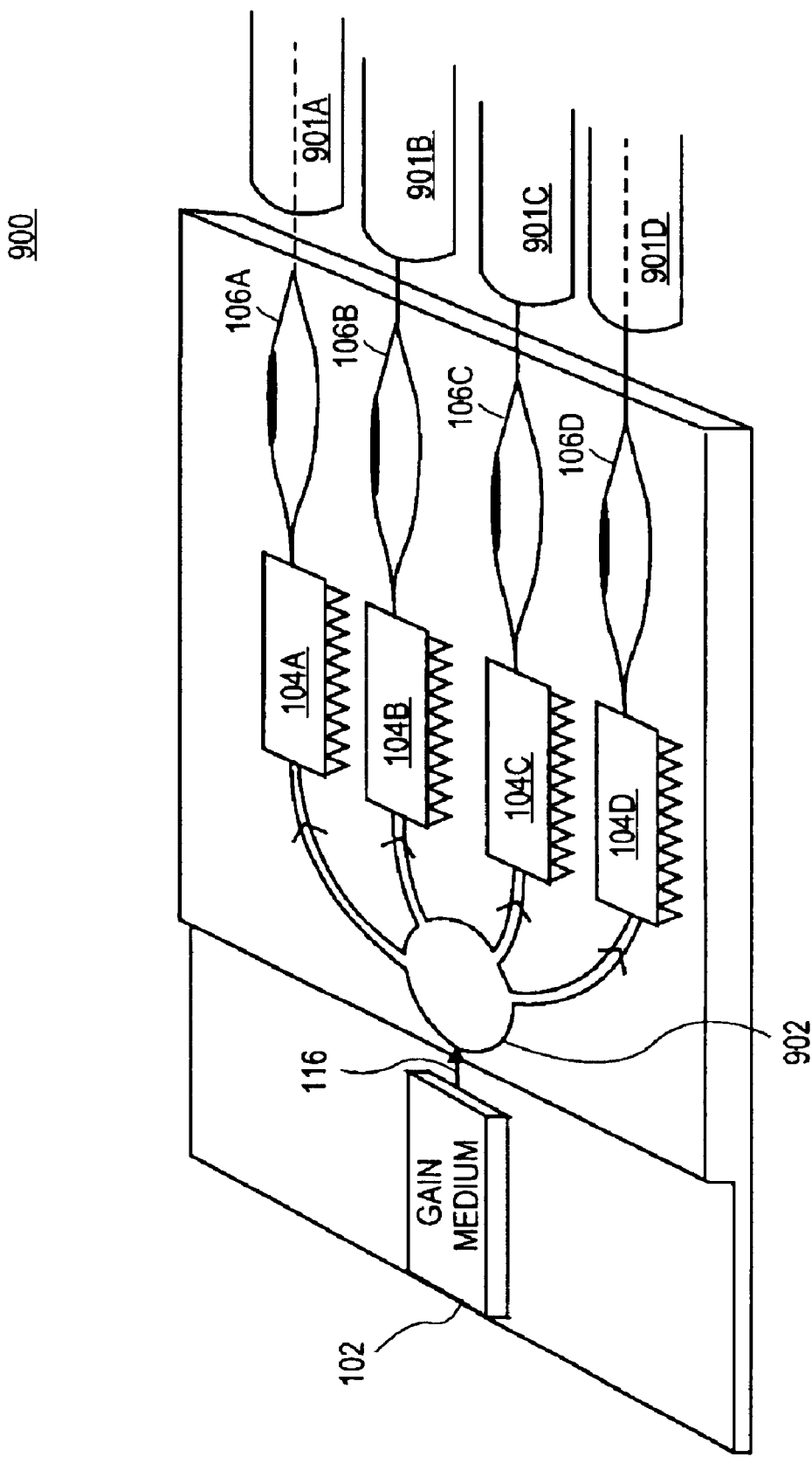
FIG. 9 illustrates yet another embodiment of the integrated optical transmit module in accordance with the teachings of the present invention.

FIG. 9 illustrates an embodiment where an optic transmit module 900 further includes optical splitter 902 optically coupled to split the optical beam 116 generated from a single gain medium 102 into a plurality of optical beams. In one embodiment, 1×N optical splitter 902 is an multi-mode interference (MMD optical splitter or the like. As shown, a tunable Bragg grating 104A, 104B, 104C, and 104d may be optically coupled to optical splitter 902 to receive and tune an output wavelength of a respective one of the plurality of optical beams. In an embodiment, tunable Bragg gratings 104A, 104B, 104C, and 104D are each tuned to a different output wavelength during normal operation. Optical modulators 106A 106B, 106C, and 106D may each be optically coupled to a corresponding tunable Bragg grating 104A, 104B, 104C, and 104D to modulate the respective one of the plurality of optical beams. Once each of the plurality of optical beams passes through modulator 106A, 106B, 106C, and/or 106D each optical beam may enter a separate optic fiber 901A, 901B, 901C, and/or 901D.

Figure 10:
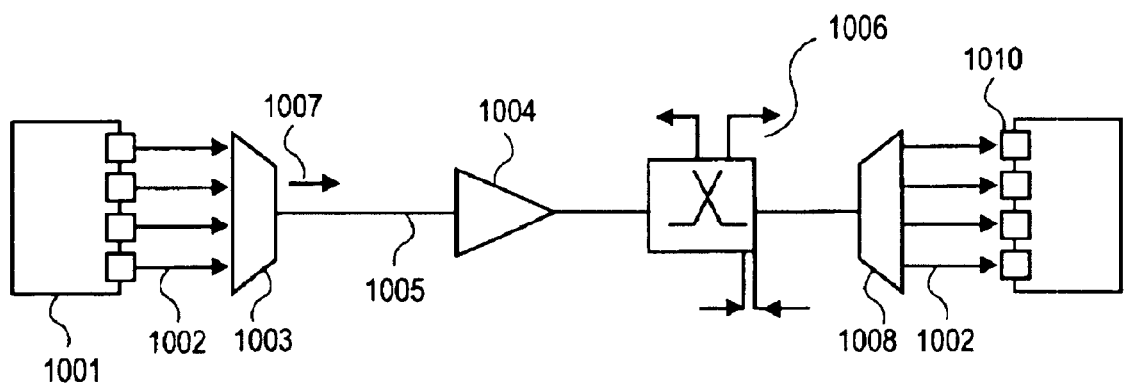
FIG. 10 is a block diagram of an embodiment of an optical communications system including an integrated optical transmit module as part of a WDM network in accordance with the teachings of the present invention.

FIG. 10 is an illustration of an embodiment of an optical communications system 1000 that includes an optical transmit module in accordance with the teachings of the present invention. The optical communications system 1000 includes an optic transmit module 1001 that may direct a plurality of optical beams 1002 generated in the semiconductor substrate 111 to a multiplexer 1003. The multiplexer 1003 may multiplex the plurality of optical beams 1002 into a WDM optical beam 1007. The WDM optical beam 1007 may then be directed along an optical fiber 1005 in an optical network and may be amplified by an amplifier 1004. In one embodiment, amplifier 1004 includes an erbium doped fiber amplifier (EDFA) or the like. In one embodiment, an optical add/drop or switch 1006 may also be included along optical fiber 1005 to add or drop optical signals. In one embodiment, the WDM optical beam 1007 is received by a demultiplexer 1008 to demultiplex the WDM optical beam 1007 back into a plurality of optical beams 1002. A plurality of optical receivers 1010 may be optically coupled to receive a respective one of the plurality of optical beams.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus, comprising:
   a gain medium disposed in a semiconductor substrate;
   a tunable Bragg grating disposed in the semiconductor substrate, the tunable Bragg grating optically coupled to the gain medium so as to tune an output wavelength of an optical beam generated from the gain medium; and
   an optical modulator disposed in the semiconductor substrate, the optical modulator optically coupled to receive the optical beam, the optical modulator including a plurality of capacitors having charge modulated regions in the semiconductor substrate, wherein the optical beam is directed through the semiconductor substrate and through the charge modulated regions of the capacitors, the charge modulated regions of the capacitors in the semiconductor substrate to modulate the optical beam generated from the gain medium in response to a modulation signal.

2. The apparatus of claim 1 wherein the optical modulator comprises:
   a first optical path through the semiconductor substrate through which a first portion of the optical beam is directed;
   a second optical path through the semiconductor substrate through which a second portion of the optical beam is directed;
   first and second optical phase adjusting devices disposed in a semiconductor substrate in the first and second optical paths, respectively, the first and second optical phase adjusting devices including the plurality of capacitors having the charge modulated regions in the semiconductor substrate, the first and second optical phase adjusting devices to selectively adjust a phase difference between the first and second portions of the optical beam in response to phase adjustment signals;
   an optical confinement region disposed in the semiconductor substrate between the first and second optical paths so as to optically isolate the first optical path from the second optical path until the first and second optical paths are merged in the semiconductor substrate.

3. The apparatus of claim 2 wherein the first and second phase adjusting devices each include the plurality of charge modulated regions of the capacitors disposed in the semiconductor substrate along the first and second optical paths, respectively.

4. The apparatus of claim 1 wherein the gain medium comprises a diode disposed in the semiconductor substrate.

5. The apparatus of claim 1 wherein the gain medium comprises an InP diode disposed in the semiconductor substrate.

6. The apparatus of claim 1 wherein the gain medium and the tunable Bragg grating together form a tunable laser disposed in the semiconductor substrate, wherein an optical coupling between the gain medium and the tunable Bragg grating define a laser cavity disposed in the semiconductor substrate.

7. The apparatus of claim 1 wherein the tunable Bragg grating comprises a plurality of perturbations of a refractive index of the semiconductor substrate.

8. The apparatus of claim 7 wherein the plurality of perturbations of the refractive index of the semiconductor substrate are provided with periodic regions of silicon and polysilicon disposed in the tunable Bragg grating in the semiconductor substrate.

9. The apparatus of claim 7 wherein the plurality of perturbations of the refractive index of the semiconductor substrate are provided with periodic changes in a geometry in the tunable Bragg grating of the semiconductor substrate.

10. The apparatus of claim 7 wherein the tunable Bragg grating further comprises a heater disposed proximate to the semiconductor substrate of the tunable Bragg grating, the refractive index of the semiconductor substrate responsive to a temperature in the tunable Bragg grating of the semiconductor substrate.

11. The apparatus of claim 7 wherein the tunable Bragg grating further comprises electrodes disposed in the semiconductor substrate of the tunable Bragg grating to modulate a charge concentration in the semiconductor substrate, the refractive index of the semiconductor substrate responsive to the charge concentration in the tunable Bragg grating in the semiconductor substrate.

12. The apparatus of claim 1 further comprising a multiplexer disposed in the semiconductor substrate, the multiplexer optically coupled to an output of the optical modulator so as to multiplex the optical beam generated from the gain medium with a plurality of other optical beams.

13. The apparatus of claim 1 further comprising an optical splitter disposed in the semiconductor substrate, the optical splitter optically coupled to receive the optical beam, the optical splitter to split the optical beam into a plurality of optical beams.

14. The apparatus of claim 13 wherein the tunable Bragg grating is a first tunable Bragg grating of a plurality of Bragg gratings disposed in the semiconductor substrate, each of the plurality of Bragg gratings optically coupled to the optical splitter to receive a respective one of the plurality of optical beams, each of the plurality of Bragg gratings to tune a respective output wavelength of the respective one of the plurality of optical beams.

15. The apparatus of claim 14 wherein the optical modulator is a first optical modulator of a plurality of optical modulators disposed in the semiconductor substrate, each of the optical modulators optically coupled to a respective one of the plurality of tunable Bragg gratings to modulate the respective one of the plurality of optical beams.

16. The apparatus of claim 1 wherein the gain medium is disposed in the semiconductor substrate between the tunable Bragg grating and the optical modulator.

17. The apparatus of claim 1 wherein the tunable Bragg grating is disposed in the semiconductor substrate between the gain medium and the optical modulator.

18. A. A method, comprising:
generating an optical beam with a gain medium disposed in a semiconductor substrate;
tuning an output wavelength of the optical beam with a tunable Bragg grating disposed in the semiconductor substrate optically coupled to the gain medium; and
modulating the optical beam with an optical modulator disposed in the semiconductor substrate in response to a modulation signal by directing the optical beam through the semiconductor substrate and through charge modulated regions of a plurality of capacitors included in the optical modulator.

19. The method of claim 18 wherein the tunable Bragg grating is a first one of a plurality of Bragg gratings disposed in the semiconductor substrate, wherein the optical modulator is a first one of a plurality of optical modulators disposed in the semiconductor substrate, the method further comprising:
splitting the optical beam generated by the gain medium into a plurality of optical beams with an optical splitter disposed in the semiconductor substrate;
tuning an output wavelength of each of the plurality of optical beams with a respective one of a plurality of tunable Bragg gratings disposed in the semiconductor substrates optically coupled to receive a respective one of the plurality of optical beams; and
modulating each of the plurality of optical beams with a respective one of a plurality of optical modulators disposed in the semiconductor substrate in response to modulation signals by directing each of the plurality of optical beams through the semiconductor substrate and through charge modulated regions of the plurality of capacitors included in the optical modulator.

20. The method of claim 18 wherein modulating the optical beam with the optical modulator disposed in the semiconductor substrate comprises:
directing a first portion of the optical beam through a first path of the optical modulator in the semiconductor substrate;
directing a second portion of the optical beam through a second path of the optical modulator in the semiconductor substrate;
selectively adjusting a phase difference between the first and second portions of the optical beam in response to the modulation signal with the charge modulated regions of the plurality of capacitors disposed in the first and second optical paths of the optical modulator;
optically isolating the first and second optical paths; and
merging the first and second optical paths to combine the first and second portions of the optical beam.

21. The method of claim 18 wherein the optical beam is one of a plurality of optical beams that are generated, tuned and modulated in the semiconductor substrate, the method further comprising multiplexing the plurality of optical beams into a single wave division multiplexed (WDM) optical beam with a multiplexer disposed in the semiconductor substrate.

22. The method of claim 18 wherein tuning the output wavelength of the optical beam with the tunable Bragg grating disposed in the semiconductor substrate comprises adjusting a temperature of the semiconductor substrate including the tunable Bragg grating.

23. The method of claim 18 wherein tuning the output wavelength of the optical beam with the tunable Bragg grating disposed in the semiconductor substrate comprises adjusting a concentration of charge in the semiconductor substrate including the tunable Bragg grating.

24. An optical communications system, comprising:
an optical transmit module disposed in a semiconductor substrate, the optical transmit module including:
a gain medium disposed in the semiconductor substrate;
a tunable Bragg grating disposed in the semiconductor substrate, the tunable Bragg grating optically coupled to the gain medium so as to tune an output wavelength of an optical beam generated from the gain medium; and
an optical modulator disposed in the semiconductor substrate, the optical modulator optically coupled to receive the optical beam, the optical modulator including a plurality of capacitors having charge modulated regions in the semiconductor substrate, wherein the optical beam is directed through the semiconductor substrate and through the charge modulated regions of the capacitors, the charge modulated regions of the capacitors in the semiconductor substrate to modulate the optical beam generated from the gain medium in response to a signal;
a multiplexer optically coupled to receive a plurality of optical beams generated in the semiconductor substrate, wherein the optical beam generated from the gain medium is one of the plurality of optical beams generated in the semiconductor substrate, the multiplexer to multiplex the plurality of optical beams into a single wave division multiplexed (WDM) optical beam;

a demultiplexer optically coupled to receive the WDM optical beam through an optical fiber, the demultiplexer to demultiplex the WDM optical beam back into the plurality of optical beams; and a plurality of optical receivers, each of the optical receivers optically coupled to receive a respective one of the plurality of optical beams.

25. The optical communications system of claim 24 wherein the gain medium is one of a plurality of gain mediums disposed in the semiconductor substrate, each one of the plurality of gain mediums generating a respective one of the plurality of optical beams generated in the semiconductor substrate, the tunable Bragg grating one of a plurality of tunable Bragg gratings disposed in the semiconductor substrate, each one of the plurality of tunable Bragg gratings optically coupled to a respective one of the plurality of gain mediums so as to tune a respective output wavelength of the respective one of the plurality of optical beams, the optical modulator one of a plurality of optical modulators disposed in the semiconductor substrate, each one of the plurality of optical modulators optically coupled to a respective one of the plurality of optical beams so as to modulate the respective one of the plurality of optical beams in response to a respective modulation signal.

26. The optical communications system of claim 24 wherein the optical transmit module further includes an optical splitter optically coupled to split the optical beam generated from the gain medium into the plurality of optical beams generated in the semiconductor substrate, the tunable Bragg grating one of a plurality of tunable Bragg gratings disposed in the semiconductor substrate, each one of the plurality of tunable Bragg gratings optically coupled to a respective one of the plurality of optical beams from the optical splitter so as to tune a respective output wavelength of the respective one of the plurality of optical beams, the optical modulator one of a plurality of optical modulators disposed in the semiconductor substrate, each one of the plurality of optical modulators optically coupled to a respective one of the plurality of optical beams so as to modulate the respective one of the plurality of optical beams in response to a respective modulation signal.

27. The optical communications system of claim 24 wherein the multiplexer is included in the optical transmit module in the semiconductor substrate.

28. The optical communications system of claim 24 wherein the optical modulator in the semiconductor substrate of the optical transmit module comprises:

a first optical path through the semiconductor substrate through which a first portion of the optical beam is directed;

a second optical path through the semiconductor substrate through which a second portion of the optical beam is directed;

first and second optical phase adjusting devices disposed in a semiconductor substrate in the first and second optical paths, respectively, the first and second optical phase adjusting devices to selectively adjust a phase difference between the first and second portions of the optical beam in response to phase adjustment signals by directing the optical beam through the semiconductor substrate and through charge modulated regions of the plurality of capacitors included in the optical modulator;

an optical confinement region disposed in the semiconductor substrate between the first and second optical paths so as to optically isolate the first optical path from the second optical path until the first and second optical paths are merged in the semiconductor substrate.

29. The optical communications system of claim 24 wherein the tunable Bragg grating in the semiconductor substrate of the optical transmit module comprises a plurality of perturbations of a refractive index of the semiconductor substrate.

* * * * *

UNITED STATES PATENT AND TRADEMARK OFFICE
CERTIFICATE OF CORRECTION

PATENT NO. : 6,785,430 B2
DATED : August 31, 2004
INVENTOR(S) : Paniccia

It is certified that error appears in the above-identified patent and that said Letters Patent is hereby corrected as shown below:

Column 5,
Line 47, delete "An" and insert -- $\Delta$n --.
Line 54, delete "$n_o$" and insert -- $n_o$ --.

Column 8,
Line 47, delete "A" and insert -- $\Lambda$ --.

Column 11,
Line 26, delete "(MMD" and insert -- (MMI) --.

Signed and Sealed this

Thirty-first Day of May, 2005

JON W. DUDAS
*Director of the United States Patent and Trademark Office*